US012385159B2

(12) United States Patent
Cong et al.

(10) Patent No.: US 12,385,159 B2
(45) Date of Patent: Aug. 12, 2025

(54) IN-SITU EPI GROWTH RATE CONTROL OF CRYSTAL THICKNESS MICRO-BALANCING SENSOR

(71) Applicant: Applied Materials, Inc., Santa Clara, CA (US)

(72) Inventors: Zhepeng Cong, San Jose, CA (US); Zhiyuan Ye, San Jose, CA (US); Avinash Ishwar Shervegar, San Jose, CA (US); Enle Choo, Saratoga, CA (US); Ala Moradian, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 589 days.

(21) Appl. No.: 17/716,393

(22) Filed: Apr. 8, 2022

(65) Prior Publication Data
US 2022/0380932 A1    Dec. 1, 2022

(30) Foreign Application Priority Data
May 31, 2021 (IN) .............................. 202141024131

(51) Int. Cl.
*C30B 25/14* (2006.01)
*C23C 16/44* (2006.01)
(Continued)

(52) U.S. Cl.
CPC .......... *C30B 25/14* (2013.01); *C23C 16/4412* (2013.01); *C23C 16/52* (2013.01); *C30B 25/16* (2013.01); *H01L 21/67017* (2013.01)

(58) Field of Classification Search
None
See application file for complete search history.

(56) References Cited

U.S. PATENT DOCUMENTS 6,156,578 A * 12/2000 Tom .......................... G01G 3/13
422/62
6,295,861 B1 * 10/2001 Tom ..................... G01N 29/036
436/151
(Continued)

FOREIGN PATENT DOCUMENTS

CN     111945221 A    11/2020
EP     0823279 A2      2/1998
(Continued)

OTHER PUBLICATIONS

Office Action for Japanese Application No. 2023-543124 dated Jul. 30, 2024.
(Continued)

*Primary Examiner* — Jethro M. Pence
(74) *Attorney, Agent, or Firm* — Patterson + Sheridan, LLP

(57) ABSTRACT

A method and apparatus for processing semiconductor substrates is described herein. The apparatus includes one or more growth monitors disposed within an exhaust system of a deposition chamber. The growth monitors are quartz crystal film thickness monitors and are configured to measure the film thickness grown on the growth monitors while a substrate is being processed within the deposition chamber. The growth monitors are connected to a controller, which adjusts the heating apparatus and gas flow apparatus settings during the processing operations. Measurements from the growth monitors as well as other sensors within the deposition chamber are used to adjust processing chamber models of the deposition chamber as substrates are processed therein.

20 Claims, 7 Drawing Sheets

(51) Int. Cl.
   *C23C 16/52*   (2006.01)
   *C30B 25/16*   (2006.01)
   *H01L 21/67*   (2006.01)

(56) References Cited

U.S. PATENT DOCUMENTS

| | | |
|---|---|---|
| 10,600,651 B2 | 3/2020 | Tsuji et al. |
| 11,056,370 B2 | 7/2021 | Ogawa et al. |
| 2003/0124820 A1 | 7/2003 | Johnsgard et al. |
| 2006/0233969 A1* | 10/2006 | White ................... C23C 14/547 |
| | | 118/723 R |
| 2011/0017135 A1 | 1/2011 | Murata |
| 2014/0053779 A1* | 2/2014 | Martinson ............... C23C 16/52 |
| | | 118/723 R |
| 2015/0013604 A1 | 1/2015 | Nakagawa et al. |
| 2015/0125591 A1* | 5/2015 | Hsieh .................. C23C 16/4402 |
| | | 118/712 |
| 2016/0268139 A1* | 9/2016 | Liu .................... H01J 37/32972 |
| 2017/0256463 A1 | 9/2017 | Bailey, III et al. |
| 2017/0338117 A1 | 11/2017 | Tsuji et al. |
| 2018/0166306 A1* | 6/2018 | Hou .................. H01L 21/67173 |
| 2019/0189493 A1 | 6/2019 | Ogawa et al. |
| 2020/0033294 A1* | 1/2020 | Offermanns ............ C23C 14/12 |
| 2020/0135520 A1* | 4/2020 | Reuter ............... B01D 53/0446 |
| 2020/0176291 A1* | 6/2020 | Rinzan .............. C23C 16/45525 |

FOREIGN PATENT DOCUMENTS

| | | |
|---|---|---|
| JP | H08246155 A | 9/1996 |
| JP | 2009228059 A | 10/2009 |
| JP | 2016111226 A | 6/2016 |
| JP | 201822830 A | 2/2018 |
| KR | 10-2013-0038623 A | 4/2013 |
| WO | 2009116576 A1 | 9/2009 |
| WO | 2016093195 A1 | 6/2016 |
| WO | 2018025855 A1 | 2/2018 |

OTHER PUBLICATIONS

Office Action for Korean Application No. 10-2023-7024878 dated Jun. 24, 2024.

Muroi, et al., Real Time Evaluation of Silicon Epitaxial Growth Process by Exhaust Gas Measurement using Quartz Crystal Microbalance, Materials Science in Semiconductor Processing, 88 (2018), pp. 192-197.

International Search Report and Written Opinion for International Application No. PCT/US2022/023967 dated Jul. 26, 2022.

Extended European Search Report for European Application No. 22816606.2 dated Mar. 10, 2025.

* cited by examiner

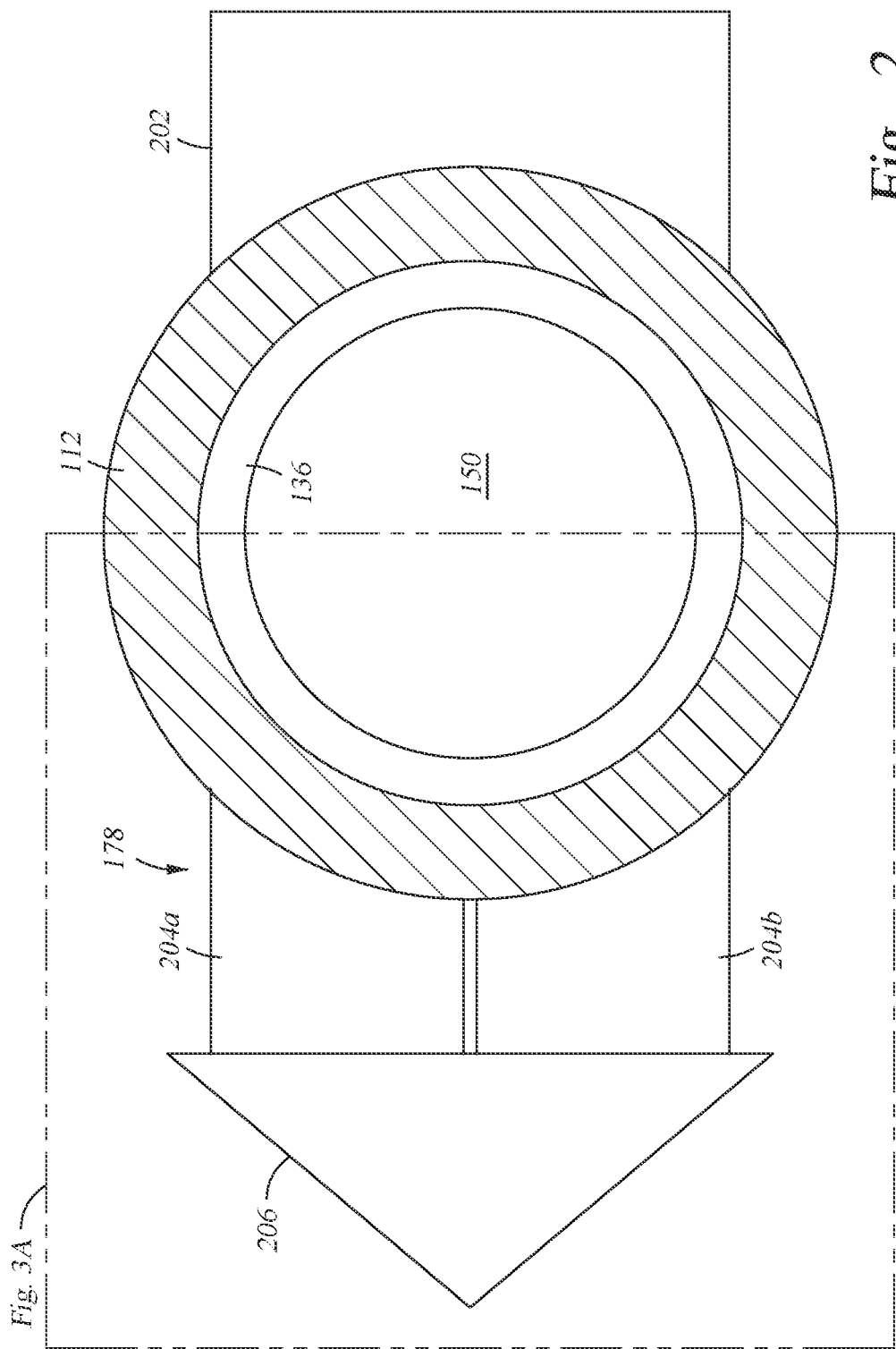

IN-SITU EPI GROWTH RATE CONTROL OF CRYSTAL THICKNESS MICRO-BALANCING SENSOR

CROSS-REFERENCE TO RELATED APPLICATIONS

This application claims benefit of Indian provisional patent application serial number 202141024131, filed May 31, 2021, which is herein incorporated by reference in its entirety.

BACKGROUND

Field

Embodiments of the present disclosure generally relate to apparatus and methods for fabricating semiconductor devices. More specifically, apparatus disclosed herein relate to exhaust assemblies and growth rate sensors within a semiconductor process chamber. Methods of using the same are also disclosed.

Description of the Related Art

Semiconductor substrates are processed for a wide variety of applications, including the fabrication of integrated devices and microdevices. During processing, the substrate is positioned on a susceptor within a process chamber. The susceptor is supported by a support shaft, which is rotatable about a central axis. Precise control over a heating source is preferred to uniformly heat the substrate within strict tolerances. The temperature of the substrate can affect the uniformity of the material deposited on the substrate.

The ability to precisely control substrate temperatures within the process chamber has a significant impact on throughput and production yields. Conventional process chambers have difficulty meeting temperature control criteria needed to fabricate next generation devices while meeting ever increasing demands for improved production yields and faster throughput. Process gases are flowed across a process volume within the process chamber. The process gases are flowed parallel to the substrate surface from one side of the process chamber to an opposite side of the process chamber. Heating and gas flow within the process chamber may be adjusted to improve film deposition rates across the substrates. Current sensors within the process chamber have limited resolution and the addition of additional sensors increases the downtime of the process chamber and increases the cost of ownership. Substrates processed between calibration and measurement operations also have less precise deposition rates due to changes in chamber conditions. Current sensors within a process chamber include pyrometers, but pyrometers have limited resolution. Downstream pressure sensors fail to provide adequate partial pressure estimates across other portions of the process chamber.

Therefore, a need exists for improved exhaust apparatus and growth rate monitoring.

SUMMARY

The present disclosure generally relates to process chambers for semiconductor processing. In one embodiment, an exhaust passage body for substrate processing is described. The exhaust passage body includes a first exhaust plenum, a first exhaust entry opening, a first plurality of fins, a first exhaust exit opening, a first baffle plate, and at least one growth monitor. The first exhaust plenum is formed through a first end of the exhaust passage body and fluidly connected to the first exhaust plenum. The first plurality of fins are disposed adjacent to the first exhaust entry opening within the first exhaust plenum. The first exhaust exit opening is formed through a second end of the exhaust passage body and fluidly connected to the first exhaust plenum. The first baffle plate is disposed adjacent to the first exhaust exit opening and configured to narrow the width of the first exhaust plenum. The at least one growth monitor is disposed downstream of the first baffle plate and configured to measure a thickness of a material deposited on the growth monitor.

In another embodiment, an exhaust system for substrate processing is described. The exhaust system includes an exhaust passage body, an exhaust plenum, an exhaust entry opening, a plurality of fins, an exhaust exit opening, at least one baffle plate, and at least one growth monitor. The exhaust entry opening is formed through a first end of the exhaust passage body and has an entry width. The exhaust entry opening is configured to fluidly connect the exhaust plenum and a process volume. The plurality of fins are disposed adjacent to the exhaust entry opening within the exhaust plenum. The exhaust exit opening is formed through a second end of the exhaust passage body and fluidly connected to the exhaust plenum. The at least one baffle plate is disposed adjacent to the exhaust exit opening and is configured to narrow the width of the exhaust plenum to an exit width less than the entry width. The at least one growth monitor is disposed downstream of the baffle plate and configured to measure a thickness of a material deposited on the growth monitor. An exhaust collector is coupled to the exhaust passage body at the exhaust exit.

In another embodiment, a processing system for substrate processing is described. The processing system includes a chamber body forming a process volume, a substrate support disposed within the process volume of the chamber body, an upper window disposed above the substrate support, and a lower window disposed below the substrate support. Each of the upper window and the lower window further define the process volume. An injector is disposed through one side of the chamber body and is configured to introduce a process gas to the process volume. An exhaust system is disposed through a second side of the chamber body opposite the injector. The exhaust system includes an exhaust passage body, an exhaust plenum disposed through the exhaust passage body, an exhaust entry opening, a plurality of fins, an exhaust exit opening, at least one baffle plate, and at least one growth monitor. The exhaust entry opening is formed through a first end of the exhaust passage body. The exhaust entry opening is configured to fluidly connect the exhaust plenum and the process volume. The plurality of fins are disposed within the exhaust plenum. The exhaust exit opening is formed through a second end of the exhaust passage body and is fluidly connected to the exhaust plenum. The at least one baffle plate is disposed downstream of the plurality of fins and configured to narrow the width of the exhaust plenum to an exit width less than the entry width. The at least one growth monitor is disposed downstream of the baffle plate and configured to measure a thickness of a material deposited on the growth monitor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 2 illustrates a cross-sectional plan view of the deposition chamber of FIG. 1, according to embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relate to exhaust assemblies and growth rate sensors within a semiconductor process chamber. The growth rate sensors are quartz crystal film thickness monitors and enable measurement of a film thickness on the growth rate sensor. The film thickness on the growth rate sensor is equated to a growth rate on the substrate within the process chamber. The thickness measurements may then be utilized to adjust one or more process controls within the process volume of the process chamber and improve film growth across the substrate.

Quartz crystal monitors without additional protection may react with epitaxial deposition process chemistries. Therefore, quartz crystal monitors as described herein are configured to reduce reaction with epitaxial deposition process chemistries, which may negatively impact either sensor performance, sensor longevity, or process conditions within the process chamber. Coating the quartz crystal of the quartz crystal monitors reduces reaction of the quartz crystal with the process chemistries. Similarly, the use of gold containing contacts within the quartz crystal monitors reduces the chemical interaction of the sensor head metal with the process chemistries.

The location and number of quartz crystal monitors provides increased sensitivity and sensor life cycles. The configuration of the exhaust system around the quartz crystal monitors further enables the gas flow within the process volume to remain the same or have minimal flow impact, while increasing process gas flow across the quartz crystal monitors to improve growth rate on the quartz crystal monitors. Therefore, the exhaust system may include configurations of fins and baffles to control gas flow rate. The fins, baffles, and other components of the exhaust system may further be formed from or coated with a material to increase heat retention of the process gas as the process gas flows through the exhaust system. This enables more predictable and enhanced film growth on the quartz crystal monitors.

Software algorithms within the process chamber controller take the growth rate measurements from the quartz crystal monitors and enable calibration of other sensors within the process chamber as well as process conditions within the process chamber to improve film thickness growth rates.

Figure 1:
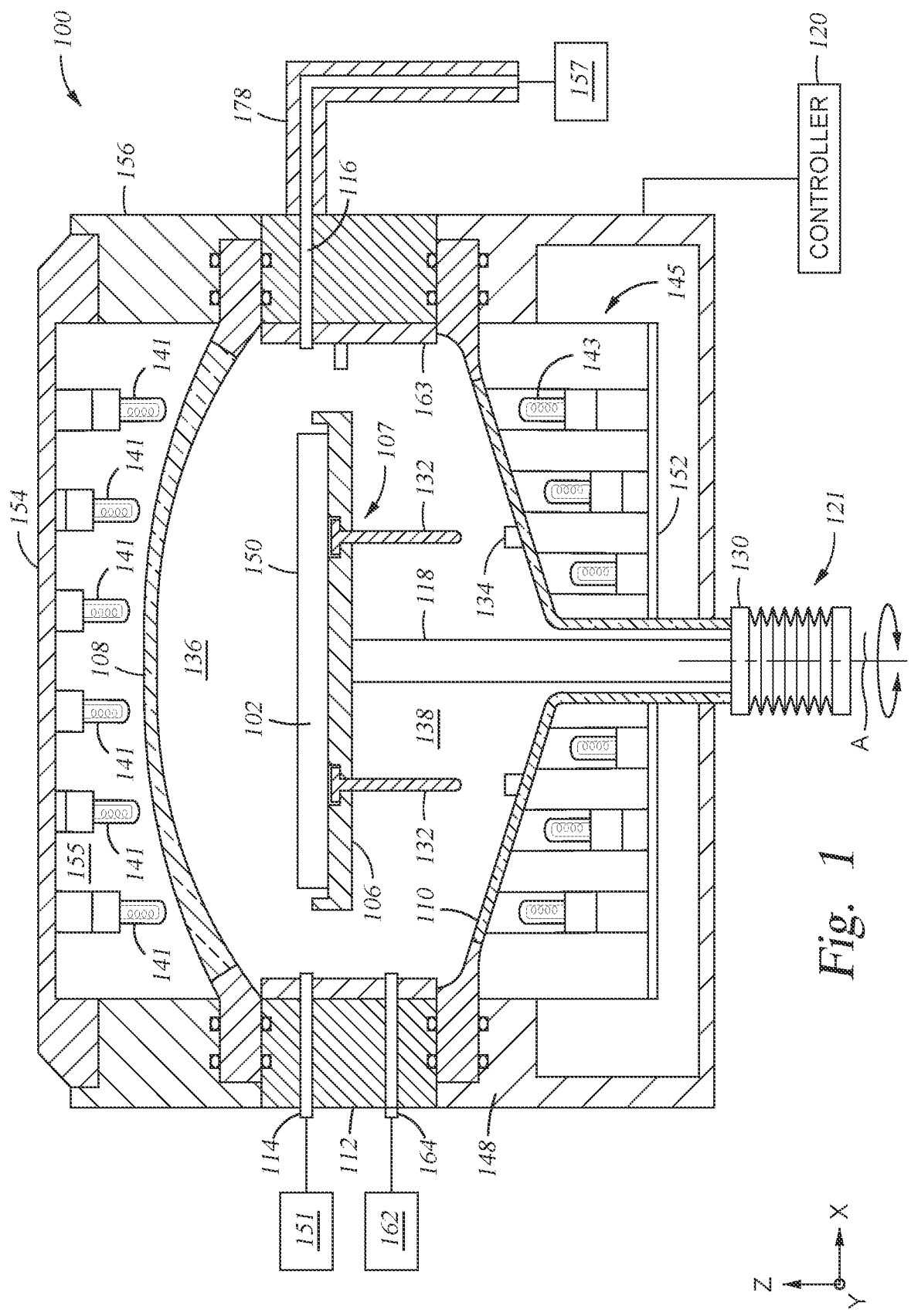
FIG. 1 is a schematic illustration of a deposition chamber, according to embodiments of the present disclosure.

FIG. 1 is a schematic illustration of a deposition chamber 100, according to embodiments of the present disclosure. The deposition chamber 100 is an epitaxial deposition chamber. The deposition chamber 100 is utilized to grow an epitaxial film on a substrate, such as the substrate 102. The deposition chamber 100 creates a cross-flow of precursors across the top surface 150 of the substrate 102.

The deposition chamber 100 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106, an upper window 108, a lower window 110, a plurality of upper lamps 141, and a plurality of lower lamps 143. As shown, the controller 120 is in communication with the deposition chamber 100 and is used to control processes, such as those described herein. The substrate support 106 is disposed between the upper window 108 and the lower window 110. The plurality of upper lamps 141 are disposed between the upper window 108 and a lid 154. The plurality of upper lamps 141 form a portion of the upper lamp module 155. The lid 154 may include a plurality of sensors (not shown) disposed therein for measuring the temperature within the deposition chamber 100. The plurality of lower lamps 143 are disposed between the lower window 110 and a floor 152. The plurality of lower lamps 143 form a portion of a lower lamp module 145. The upper window 108 is an upper dome and is formed of an energy transmissive material, such as quartz. The lower window 110 is a lower dome and is formed of an energy transmissive material, such as quartz.

A process volume 136 is formed between the upper window 108 and the lower window 110. The process volume 136 has the substrate support 106 disposed therein. The substrate support 106 includes a top surface on which the substrate 102 is disposed. The substrate support 106 is attached to a shaft 118. The shaft is connected to a motion assembly 121. The motion assembly 121 includes one or more actuators and/or adjustment devices that provide movement and/or adjustment of the shaft 118 and/or the substrate support 106 within the process volume 136.

The substrate support 106 may include lift pin holes 107 disposed therein. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a process position to a transfer position.

The flow module 112 includes a plurality of process gas inlets 114, a plurality of purge gas inlets 164, and one or more exhaust gas outlets 116. The plurality of process gas inlets 114 and the plurality of purge gas inlets 164 are disposed on the opposite side of the flow module 112 from the one or more exhaust gas outlets 116. One or more flow guides are disposed below the plurality of process gas inlets 114 and the one or more exhaust gas outlets 116. The flow guide is disposed above the purge gas inlets 164. A liner 163 is disposed on the inner surface of the flow module 112 and protects the flow module 112 from reactive gases used during deposition processes. The process gas inlets 114 and the purge gas inlets 164 are positioned to flow a gas parallel to the top surface 150 of a substrate 102 disposed within the process volume 136. The process gas inlets 114 are fluidly connected to a process gas source 151. The purge gas inlets 164 are fluidly connected to a purge gas source 162. The one or more exhaust gas outlets 116 are fluidly connected to an exhaust pump 157.

The one or more exhaust gas outlets 116 are further connected to or include an exhaust system 178. The exhaust system 178 fluidly connects the one or more exhaust gas outlets 116 and the exhaust pump 157. The exhaust system 178 as described herein includes one or more growth monitors 310 (FIG. 3A) and is configured to assist in the controlled deposition of a layer on the substrate 102.

FIG. 2 illustrates a cross-sectional plan view of the deposition chamber 100 of FIG. 1, according to embodiments of the present disclosure. The deposition chamber 100 includes an injector 202 disposed across from the exhaust system 178. The injector 202 includes the process gas inlets 114 and is fluidly coupled to the process gas source 151. The injector 202 may be disposed through at least a portion of the flow module 112 or may be a part of the flow module 112. The exhaust system 178 is disposed on the opposite side of the process volume 136 from the injector 202. The exhaust system 178 is formed through, attached to, or a part of the flow module.

The exhaust system 178 further includes at least one exhaust passage body 204a, 204b. The exhaust passage bodies 204a, 204b form an exhaust path for gas leaving the process volume 136 before entering an exhaust collector 206. As shown in FIG. 2, there is a first exhaust passage body 204a and a second exhaust passage body 204b. The first exhaust passage body 204a and the second exhaust passage body 204b are mirror images and may be similar in size and configuration. In other embodiments, there may be more or less exhaust passage bodies 204a, 204b. In some embodiments, there is only one exhaust passage body, such that the two exhaust passage bodies 204a, 204b are merged into a single body. In yet other embodiments, there may be three or more exhaust passage bodies, such as three exhaust passage bodies 204a, 204b. The size and configuration of the exhaust passage bodies 204a, 204b may change depending upon the size and operation of the deposition chamber 100.

Both of the first exhaust passage body 204a and the second exhaust passage body 204b are coupled to the exhaust collector 206 on the opposite end of the exhaust passage bodies 204a, 204b from the process volume 136. The exhaust collector 206 is configured to collect the exhaust from the first exhaust passage body 204a and the second exhaust passage body 204b. The exhaust collector 206 narrows as the exhaust collector 206 extends away from the exhaust passage bodies 204a, 204b.

Figure 3A:
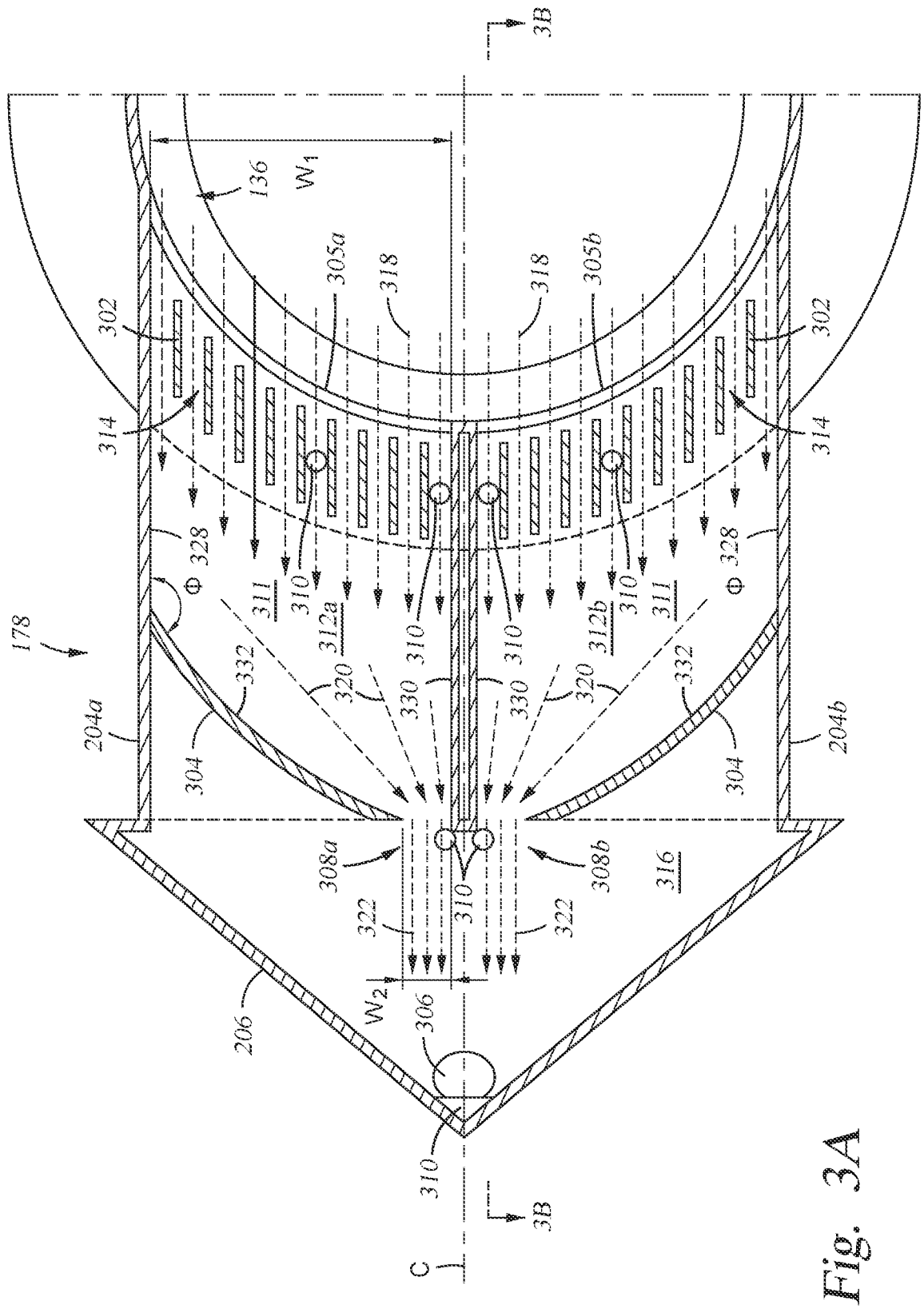
FIG. 3A illustrates a cross-sectional plan view of the exhaust system of the deposition chamber of FIG. 1, according to embodiments of the present disclosure.

FIG. 3A illustrates a cross-sectional plan view of the exhaust system 178 of the deposition chamber 100 of FIG. 1, according to embodiments of the present disclosure. The exhaust system 178 is configured to control the exhaust gas flow exiting the process volume 136 before being flowed over one or more growth monitors 310. Increased flow volume over the growth monitors 310 relative to the flow volume at the entrance to the exhaust passage bodies 204a, 204b enhances film growth on the growth monitors 310. Therefore, the width of each of the exhaust passage bodies 204a, 204b is narrowed from an entry width $W_1$ to an exit width $W_2$ to enhance flow volume. A fin array 314 and one or more baffles 304 are positioned within each of the exhaust passage bodies 204a, 204b to enable the narrowing of the exhaust passage bodies 204a, 204b, while reducing the impact of the narrowing on the flow path of the process gases through the process volume 136.

As the process gas flows out of the process volume 136 and into the exhaust system 178, the process gas is flowing in a first flow path 318. The first flow path 318 is primarily parallel with the top surface 150 of the substrate 102 and the gas flow out of the injector 202. The process gas is flowed into the exhaust system 178 through an exhaust entry opening 305a, 305b disposed through each of the exhaust passage bodies 204a, 204b. Therefore, a first exhaust entry opening 305a is disposed through a first end of the first exhaust passage body 204a, while a second exhaust entry opening 305b is disposed through a first end of the second exhaust passage body 204b. The exhaust entry openings 305a, 205b are in fluid communication with exhaust plenums 312a, 312b. The exhaust plenums 312a, 312b are disposed within each of the exhaust passage bodies 204a, 204b. Therefore, a first exhaust plenum 312a is disposed within the first exhaust passage body 204a and a second exhaust plenum 312b is disposed within the second exhaust passage body 204b. The first exhaust entry opening 305a is in fluid communication with the first exhaust plenum 312a and the second exhaust entry opening 305b is in fluid communication with the second exhaust plenum 312b.

Each of the exhaust entry openings 305a, 305b have an entry width $W_1$. The entry width $W_1$ is about 10 mm to about 210 mm, such as about 45 mm to about 210 mm, such as about 75 mm to about 175 mm, such as about 100 mm to about 155 mm. The entry width $W_1$ is therefore less than or equal to half of the width of the process volume 136.

An exhaust exit opening 308a, 308b is disposed on the opposite side of the exhaust passage bodies 204a, 204b from the exhaust entry openings 305a, 305b. Therefore, a first exhaust exit opening 308a is disposed on a second side of the first exhaust passage body 204a opposite the first side and in fluid communication with the first exhaust plenum 312a. The second exhaust exit opening 308b is disposed on a second side of the second exhaust passage body 204b opposite the first side and in fluid communication with the second exhaust plenum 312b. The exhaust exit openings 308a, 308b are smaller in width than the exhaust entry openings 305a, 305b. The exhaust exit openings 308a, 308b have an exit width $W_2$ of about 15 mm to about 110 mm, such as about 20 mm to about 100 mm, such as about 20 mm to about 40 mm. The exit width $W_2$ being smaller than the entry width $W_1$ enables a higher concentration of process gases to flow over the growth monitors 310.

The ratio of the entry width $W_1$ to the exit width $W_2$ is about 2:1 to about 20:1, such as about 3:1 to about 10:1, such as about 4:1 to about 8:1. The ratio of the entry width $W_1$ to the exit width $W_2$ enables good film growth on the growth monitors 310, while reducing the impact of the reduced exit width $W_2$ on backpressure and flow path through the process volume 136.

Process gases flowing through the deposition chamber 100 enter the exhaust passage bodies 204a, 204b through the exhaust entry openings 305a, 305b while in the first flow path 318 before changing to a second flow path 320 as one or more baffles 304 narrows the exhaust plenums 312a, 312b to the exit width $W_2$ adjacent the exhaust exit openings 308a, 308b. The second flow path 320 brings the process gases towards a center line C of the exhaust system and towards one side of the exhaust plenums 312a, 312b, such as the inner side of the exhaust plenums 312a, 312b. Once the process gases are flowed through the exhaust exit openings 308a, 308b, the path of the process gases is changes to a third flow path 322. The third flow path 322 is a condensed flow path. The third flow path 322 is disposed through the collector plenum 316. The collector plenum 316 is a plenum disposed within the exhaust collector 206.

The fin arrays 314 disposed within each of the exhaust passage bodies 204a, 204b are configured to maintain the first flow path 318 through at least a portion of the exhaust plenums 312a, 312b. The fin arrays 314 include a plurality of fins 302, such that a first plurality of fins 302 are disposed within the first exhaust plenum 312a of the first exhaust passage body 204a. Each of the first plurality of fins 302 extends from the first exhaust entry opening 305a towards the first exhaust exit opening 308a. A second plurality of fins 302 are disposed within the second exhaust plenum 312b and the second exhaust passage body 204b. Each of the second plurality of fins 302 extends from the second exhaust entry opening 305b towards the second exhaust exit opening 308b. The fin arrays 314 are configured to maintain good flow control through the process volume 136 and extend from a position adjacent to the exhaust entry openings 305a, 305b.

The number of fins 302 within the fin arrays 314 may be at least two fins 302, such as at least four fins 302, such as at least 5 fins 302, such as 5 fins 302 to about 30 fins 302, such as 5 fins 302 to about 20 fins 302. The number of fins 302 assists in creating smaller gaps between each adjacent fin 302 and control of the first flow path 318.

One or more growth monitors 310 are disposed within the fin arrays 314, such as between two adjacent fins 302. There may be two or more growth monitors 310 disposed within each fin array 314 of both the first exhaust passage body 204a and the second exhaust passage body 204b. The growth monitors 310 within the fin arrays 314 may assist in providing measurements of the growth rate at different radial positions on the substrate 102.

Each of the fins 302 within the fin arrays 314 are parallel to one another. The fins 302 extend in a direction parallel to the desired first flow path 318 and parallel to the gas flowing out of the injector 202. Other configurations of the fin arrays 314 are contemplated. In some embodiments, each of the fins 302 are a similar length. In other embodiments, each of the fins 302 are not necessarily the same length, such that fins 302 closer to the centerline C of the process volume 136 and the exhaust system 178 are shorter than fins 302 further from the centerline C.

Once the process gases leave the fin arrays 314, the process gases are flown into the main portion 311 of the exhaust plenums 312a, 312b. The main portion 311 of the exhaust plenums 312a, 312b is an open space and may assist in reducing backpressure which would build up if the fin arrays 314 extended all the way to the baffles 304. In some embodiments, there is a gap of at least 5 mm between the end of the fin arrays 314 and the closest portion of the baffle 304, such as about 5 mm to about 40 mm.

The baffles 304 extends from an outer surface 328 of each of the exhaust passage bodies 204a, 204b and towards an inner surface 330 of each of the exhaust passage bodies 204a, 204b. The outer surface 328 is the inside surface of the exhaust plenums 312a, 312b furthest from the centerline C. The inner surface 330 is the inside surface of the exhaust plenums 312a, 312b closest to the centerline C. Therefore, the baffle 304 within the first exhaust passage body 204a extends from the outer surface 328 of the first exhaust plenum 312a and towards the inner surface 330 of the first exhaust plenum 312a or the centerline C of the exhaust system 178. The baffle 304 within the second exhaust passage body 204b extends from the outer surface 328 of the second exhaust plenum 312b and towards the inner surface 330 of the second exhaust plenum 312b or the centerline C of the exhaust system 178.

The baffles 304 extends at an angle $\phi$ with respect to the outer surface 328 of each of the exhaust plenums 312a, 312b. The angle $\phi$ is the inside angle facing the fin array 314. The angle $\phi$ is an obtuse angle, such that the angle $\phi$ is greater than about 90 degrees, such as about 100 degrees to about 170 degrees, such as about 100 degrees to about 160 degrees, such as about 110 degrees to about 145 degrees. The angle at which the baffle plate 304 is disposed assists in controlling the rate of restriction of the exhaust plenums 312a, 312b. The baffle plates 304 are disposed at an angle other than 0 degrees or 90 degrees with respect to the orientation of the fins 302, such as between about 10 degrees and about 80 degrees with respect to the orientation of the fins 302. The baffle plates 304 extend across over 50% of the width of each of the exhaust plenums 312a, 312b, such as over 60% of the width of each of the exhaust plenums 312a, 312b, such as over 70% of the width of each of the exhaust plenums 312a, 312b. In some embodiments, the baffle plates 304 have a radius of curvature defined as the radius from the center of the process volume 136 of the deposition chamber 100 to a gas guide surface 332. In some embodiments, the radius of curvature changes across the gas guide surface 332, such that the portion of the gas guide surface 332 closer to the inner surfaces 330 has a smaller radius of curvature. The radius of curvature of the gas guide surface 332 may also be other radii other than the radius from the center of the process volume 136. Each baffle plate 304 has a gas guide surface 332. The gas guide surface 332 is the surface of the baffle plate 304 facing the main portion 311 of the exhaust plenums 312a, 312b as well as the fin arrays 314.

The baffles 304 may have either a curved gas guide surface 332, a straight gas guide surface 332, or a multi-faceted gas guide surface 332. The gas guide surface 332 is shown as being curved in FIG. 3A, but may be straight in some embodiments. In curved embodiments, the gas guide surface 332 follows a circumference of a circle, an ellipse, a hyperbola, or a parabola. A curved surface allows for better gas flow control with reduced eddying or turbulence within the gas flow path.

The curvature of the gas guide surface 332 may vary depending upon the size of the deposition chamber 100 and the size of the exhaust system 178. The gas guide surface 332 having a large radius of curvature enables smooth guidance of gas flow through the exhaust plenums 312a, 312b.

The exhaust exit openings 308a, 308b are disposed between an innermost portion of each of the baffles 304 and the inner surface 330 of each of the exhaust plenums 312a, 312b. The first exhaust exit opening 308a is disposed within the first exhaust plenum 312a and connects the first exhaust plenum 312a to the collector plenum 316. The second exhaust exit opening 308b is disposed within the second exhaust plenum 312b and connects the second exhaust plenum 312b to the collector plenum 316.

One or more growth monitors 310 are located either within the exhaust exit openings 308a, 308b or just downstream of the exhaust exit openings 308a, 308b. A first growth monitor 310 is disposed within the first exhaust exit opening 308a or just downstream of the exhaust exit opening 308a. A second growth monitor 310 is disposed within the second exhaust exit opening 308b or just downstream of the second exhaust exit opening 308b. The growth monitors 310 being disposed just downstream of the exhaust exit openings 308a, 308b is defined as the growth monitors 310 being disposed within 10 mm of the exhaust exit openings 308a, 308b and away from the fin arrays 314.

The baffles 304 narrow the passage through which exhaust gases pass through the exhaust plenums 312a, 312b and therefore increase the density or concentration of the exhaust gases flowing over the growth monitors 310. The growth monitors 310 are disposed in either a top surface 326 or a bottom surface 327 (FIG. 3B) of the exhaust plenums 312a, 312b so that the growth monitors 310 do not block the third flow path 322, but are instead disposed in line with the third flow path 322. The growth monitors 310 are located at least partially inside of the collector plenum 316.

Figure 3B:
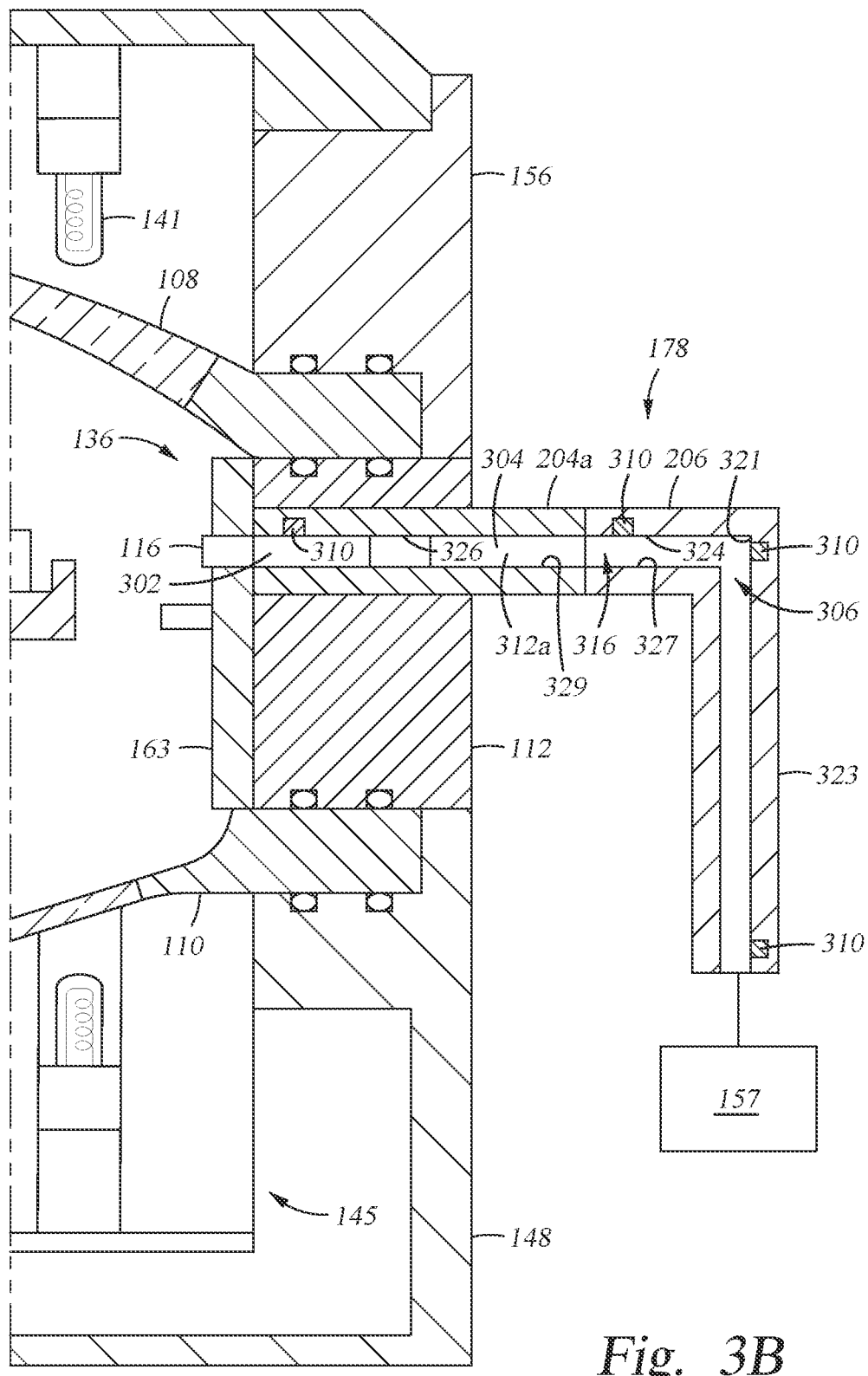
FIG. 3B illustrates a cross-sectional side view of the exhaust system of the deposition chamber of FIG. 1, according to embodiments of the present disclosure.

Exhaust gas passes over the growth monitors 310 and into the collector plenum 316 before being removed from the exhaust collector 206 through a conduit opening 306 of the exhaust conduit 323 (FIG. 3B). The width of the collector plenum 316 adjacent to the exhaust exit openings 308a, 308b is wider than the exhaust exit openings 308a, 308b, such that the width of the collector plenum 316 adjacent to each of the exhaust exit openings 308a, 308b is similar to the entry width $W_1$ and the total width of the collector plenum 316 is similar to or greater than two times the entry width $W_1$.

The conduit opening 306 is disposed at a portion of the collector plenum 316 opposite the exhaust exit openings 308a, 308b. The conduit opening 306 is configured to enable venting of the exhaust gas within the exhaust collector 206 through an exhaust conduit 323 and to an exhaust pump 157. Adjacent to the conduit opening 306 and within the collector plenum 316 is another growth monitor 310. The growth monitor 310 adjacent to the conduit opening 306 is disposed on a back sidewall 321 (FIG. 3B) of the collector plenum 316 furthest from the exhaust exit openings 308a, 308b. In some embodiments, the growth monitor 310 is disposed directly above the conduit opening 306 or within the conduit opening 306, such as within an upper portion of the exhaust conduit 323.

At least the fins 302 and the baffles 304 are formed from or coated with a material with a high thermal conductivity, such as a material with a thermal conductivity of above about 100 W/m·° K, such as above about 150 W/m·° K, such as above about 175 W/m·° K. The material of the fins 302 is chosen to reduce contamination of the deposition chamber 100 while also maintaining the temperature of the exhaust gas flowing through the exhaust plenums 312a, 312b before flowing over the growth monitors 310. In some embodiments, at least a portion of the wall forming the exhaust plenums 312a, 312b is coated in the high thermal conductivity material similar to the fins 302 and the baffles 304. The inside of the exhaust collector 206 may similarly be coated in the high thermal conductivity material. The high thermal conductivity material may be silicon carbide (SiC). Other suitable high thermal conductivity materials are contemplated. In some embodiments, the fins 302 and the baffles 304 are formed of graphite and coated with silicon carbide. The high thermal conductivity material conducts heat from the process volume 136 and reduces the rate of cooling of exhaust gases flowed through the exhaust plenums 312a, 312b. Keeping the exhaust gases heated before being flowed over the growth monitors 310 enables more consistent film formation on the growth monitors 310 to provide more accurate estimates of film growth rates within the process chamber.

FIG. 3B illustrates a cross-sectional side view of the exhaust system 178 of the deposition chamber 100 of FIG. 1, according to embodiments of the present disclosure. As shown in FIG. 3B, the exhaust plenums 312a, 312b of the exhaust system 178 extend through at least a portion of the flow module 112, such that the exhaust plenums 312a, 312b extend through the flow module 112. The fins 302 are disposed adjacent to the process volume 136.

The fins 302 and the baffles 304 extend the full height of the exhaust plenums 312a, 312b, such that the fins 302 and the baffles 304 extend between the top surface 326 and the bottom surface 329 of the exhaust plenums 312a, 312b. The growth monitors within the fin arrays 314 are disposed on the top surface 326.

The exhaust collector 206 is connected to the back end of the exhaust system 178. The exhaust collector 206 includes a top surface 324, a bottom surface 327, and a back sidewall 321. The growth monitors 310 just downstream of the exhaust exit openings 308a, 308b are positioned on the top surface 324 of the collector plenum 316 within the exhaust collector 206. Another growth monitor 310 is disposed on the back sidewall 321 of the collector plenum 316. The positioning of the growth monitors 310 enables accurate film growth rate measurements by each of the growth monitors 310. The measurements from each of the growth monitors 310 may be mapped to see differences in growth rate across different positions of the substrate 102.

The conduit opening 306 is disposed through the bottom surface 327 of the collector plenum 316 and opens into the exhaust conduit 323. The exhaust conduit 323 extends downward from the conduit opening 306 and is fluidly connected to the exhaust pump 157. Another growth monitor 310 may be positioned on an inner wall of the exhaust conduit 323 downstream of the growth monitor 310 on the back sidewall 321 of the collector plenum 316.

In some embodiments, more or less growth monitors 310 may be utilized within the exhaust system 178. In some embodiments, only the growth monitors 310 adjacent to the exhaust exit openings 308a, 308b are disposed within the exhaust system 178. In other embodiments, the growth monitors 310 adjacent to the exhaust exit openings 308a, 308b may be a single growth monitor 310. In yet other embodiments, the growth monitors 310 adjacent to the exhaust exit openings 308a, 308b and the growth monitor 310 on the back sidewall 321 of the collector plenum 316 are utilized.

Figure 4:
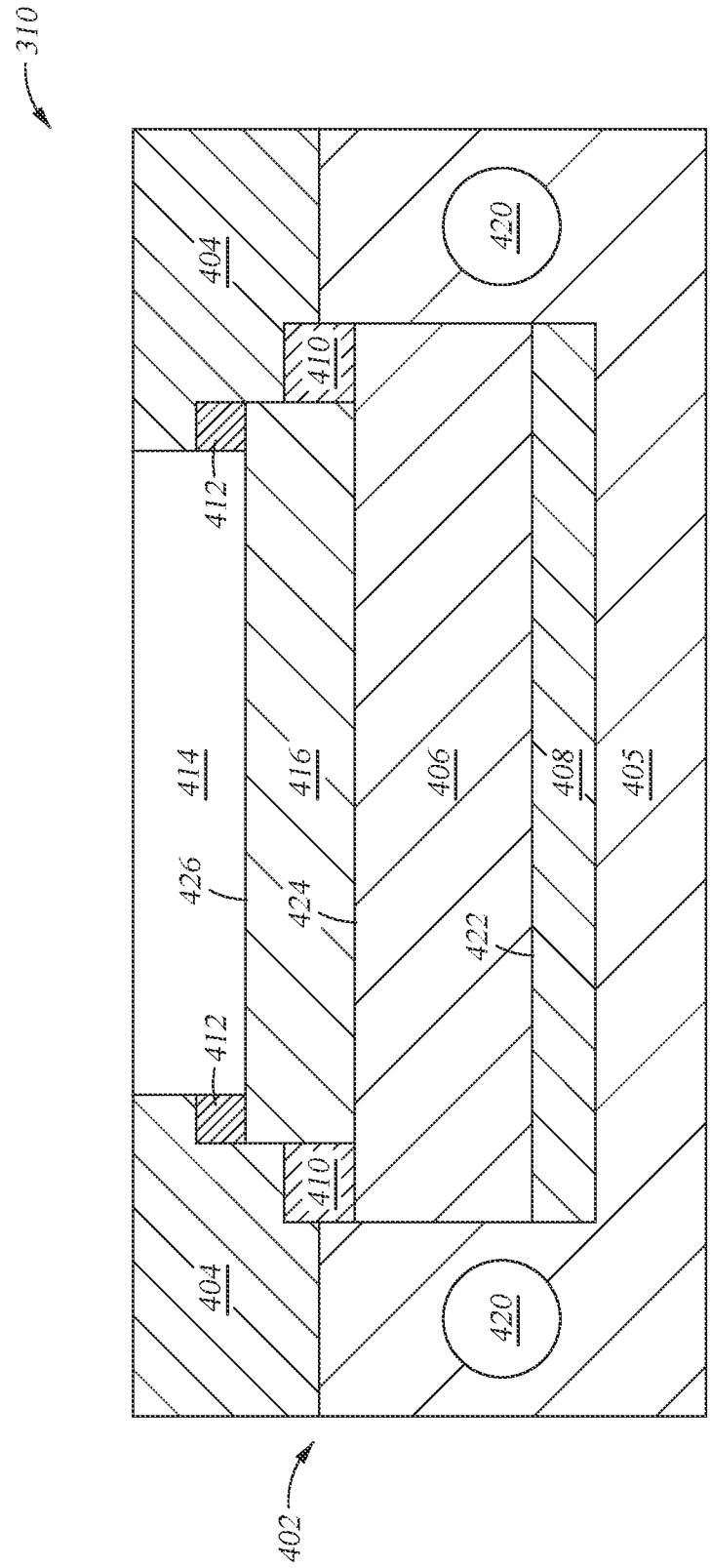
FIG. 4 illustrates a growth monitor for use within the deposition chamber of FIG. 1, according to embodiments of the present disclosure.

FIG. 4 illustrates a growth monitor 310 for use within the deposition chamber 100 of FIG. 1, according to embodiments of the present disclosure. The growth monitor 310 includes a sensor holder 402, a quartz crystal 406 disposed within the sensor holder 402, a back contact 408 contacting a first side 422 of the quartz crystal 406, a front contact 410 contacting a second side 424 of the quartz crystal 406, a protective coating 416 disposed on the second side 424 of the quartz crystal 406, and a sensor opening 414 disposed through the sensor holder 402 and exposing the protective coating 416 to gases flowing through the exhaust system 178.

The growth monitors 310 are configured to be positioned within the deposition chamber 100 and therefore account for the reactive process chemistries within the exhaust system 178. The protective coating 416 as well as the material of the sensor holder 402, the back contact 408, and the front contact 410 impact the reactivity of the growth monitors 310 with the process chemistries within the deposition chamber 100. Therefore, material compositions are chosen which reduce the reactivity of the growth monitor 310 with the process chemistries within the deposition chamber 100, while still enabling accurate film thickness measurements on the growth monitors 310.

The sensor holder 402 acts as a case in which the back contact 408, the front contact 410, and the quartz crystal 406 are disposed. The sensor holder 402 is formed in multiple parts, such as a first part 405 and a second part 404. The first part 405 has a cavity formed therein in which the back contact 408 is located. The quartz crystal 406 is also located within the cavity and contacting the back contact 408.

The second part 404 includes the sensor opening 414 disposed therethrough and is positioned over the side of the first part 405, which includes the cavity. The front contact 410 is positioned between the first part 405 and the second part 404. The front contact 410 is held in place by the gripping force of the first part 405 and the second part 404. The front contact 410 is a ring, such that the front contact 410 covers an outer portion of the second side 424 of the quartz crystal 406, but not a central portion of the second side 424. The protective coating 416 is disposed within the ring formed by the front contact 410 and contacts the second side 424 of the quartz crystal 406. The protective coating 416 is at least partially disposed within the sensor opening 414, such that the protective coating 416 is exposed to the exhaust gases flowed through the exhaust system 178. The protective coating 416 and the quartz crystal 406 are held in place at least in part by the gripping force between the first part 405 and the second part 404. One or more sealing rings 412 are disposed within the second part 404 and contact the exposed surface 426 of the protective coating 416. The one or more sealing rings 412 are configured to provide a seal between the atmosphere within the exhaust system 178 and the other components of the growth monitor 310 which are not the protective coating 416.

The protective coating 416 is formed from one of alumina ($Al_2O_3$) or a silicon oxide, such as silicon dioxide ($SiO_2$). The protective coating 416 is formed from a material which does not degrade when exposed to epitaxial deposition process conditions or process gases. The protective coating 416 may be a lens or may be a coating applied to the quartz crystal 406. The protective coating 416 has a thickness of less than about 10 µm, such as about 1 nm to about 10 nm, such as about 1 nm to about 5 nm. The small thickness enables protection of the quartz crystal 406 without significant damping of the oscillation of the quartz crystal 406.

At least one of the back contact 408 or the front contact 410 are formed from a gold containing material, such as a gold alloy or pure gold. Both of the back contact 408 and the front contact 410 may be formed from a gold containing material. The gold containing material reduces the reaction of the back contact 408 and the front contact 410 to the process chemistries within the deposition chamber 100. In some embodiments, the back contact 408 and the front contact 410 are coated in a gold containing material.

A cooling mechanism 420 is disposed through the first part 405 of the sensor holder 402. The cooling mechanism 420 may be a coolant passage disposed through the body of the first part 405. The cooling mechanism 420 may be a coolant passage configured to receive cooling water.

The one or more sealing rings 412 are formed from a polymer or plastic compatible with epitaxial deposition processes at a temperature of about 200° C. In some embodiments, the one or more sealing rings 412 may be an o-ring or another type of gasket.

Figure 5:
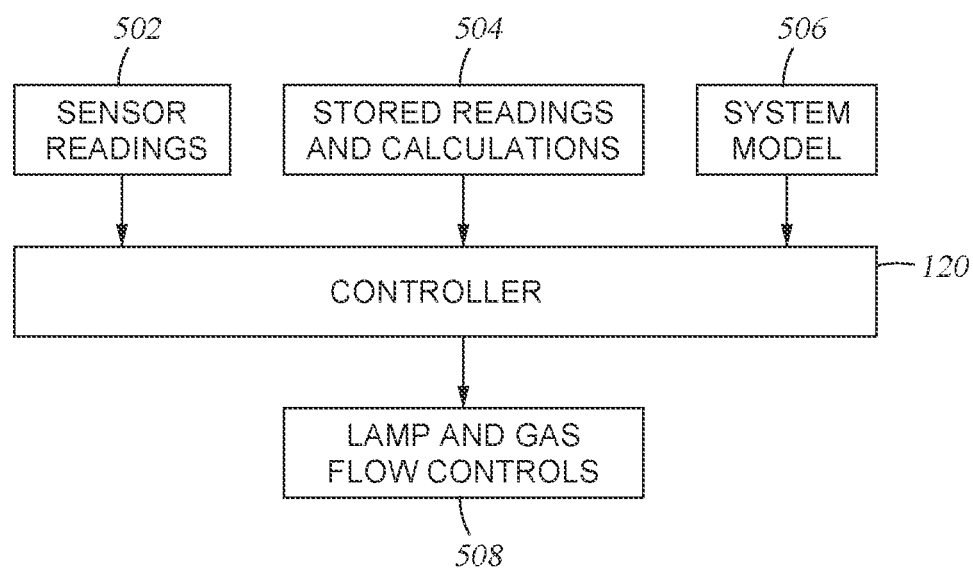
FIG. 5 illustrates a control schematic for use within the deposition chamber of FIG. 1, according to embodiments of the present disclosure.

FIG. 5 illustrates a control schematic 500 for use within the deposition chamber 100 of FIG. 1, according to embodiments of the present disclosure. The controller 120 is configured to receive data or input as sensor readings 502 from each of the growth monitors 310. The controller 120 is equipped with or in communication with a system model 506 of the deposition chamber 100. The system model 506 includes a heating model and a gas flow module. The system model 506 is a program configured to estimate the gas flow and heating within the deposition chamber 100 throughout a deposition process. The controller 120 is further configured to store readings and calculations 504.

The readings and calculations 504 include previous sensor readings 502, such as any previous sensor readings within the deposition chamber 100. The readings and calculations 504 further include the stored calculated values from after the sensor readings 502 are measured by the controller 120 and run through the system model 506. Therefore, the controller 120 is configured to both retrieve stored readings and calculations 504 as well as save readings and calculations 504 for future use. Maintaining previous readings and calculations enables the controller 120 to adjust the system model 506 over time to reflect a more accurate version of the deposition chamber 100.

In embodiments described herein, the controller 120 includes a programmable central processing unit (CPU) that is operated with a memory and a mass storage device, an input control unit, and a display unit (not shown). The controller 120 monitors the precursor, process gas, and purge gas flow. Support circuits are coupled to the CPU for supporting the processor in a conventional manner. In some embodiments, the controller 120 includes multiple controllers 120, such that the stored readings and calculations 504 and the system model 506 are stored within a separate controller from the controller 120 which operates the deposition chamber 100. In other embodiments, all of the system model 506 and the stored readings and calculations 504 are saved within the controller 120.

The controller 120 is configured to control the heating and gas flow through the deposition chamber 100 by providing an output to the lamps and gas flow controls 508. The lamps and gas flow controls 508 include the upper lamps 141, the lower lamps 143, the process gas source 151, the purge gas source 162, and the exhaust pump 157. The controller 120 may also control the motion assembly 121 within the deposition chamber 100.

The controller 120 is configured to adjust the output to each of the lamps and gas flow controls 508 based off of the sensor readings 502, the system model 506, and the stored readings and calculations 504. The controller 120 includes embedded software and a compensation algorithm to calibrate growth monitor 310 frequency shift to the film thickness on the substrate 102. The film thickness on the substrate 102 may be measured as the substrate 102 leaves the deposition chamber or between process operations to provide a reference for film thickness growth rates measured using the growth monitors 310. The controller 120 may include a machine learning algorithm and may use a regression or clustering technique. The algorithm is an unsupervised or a supervised algorithm.

Figure 6:
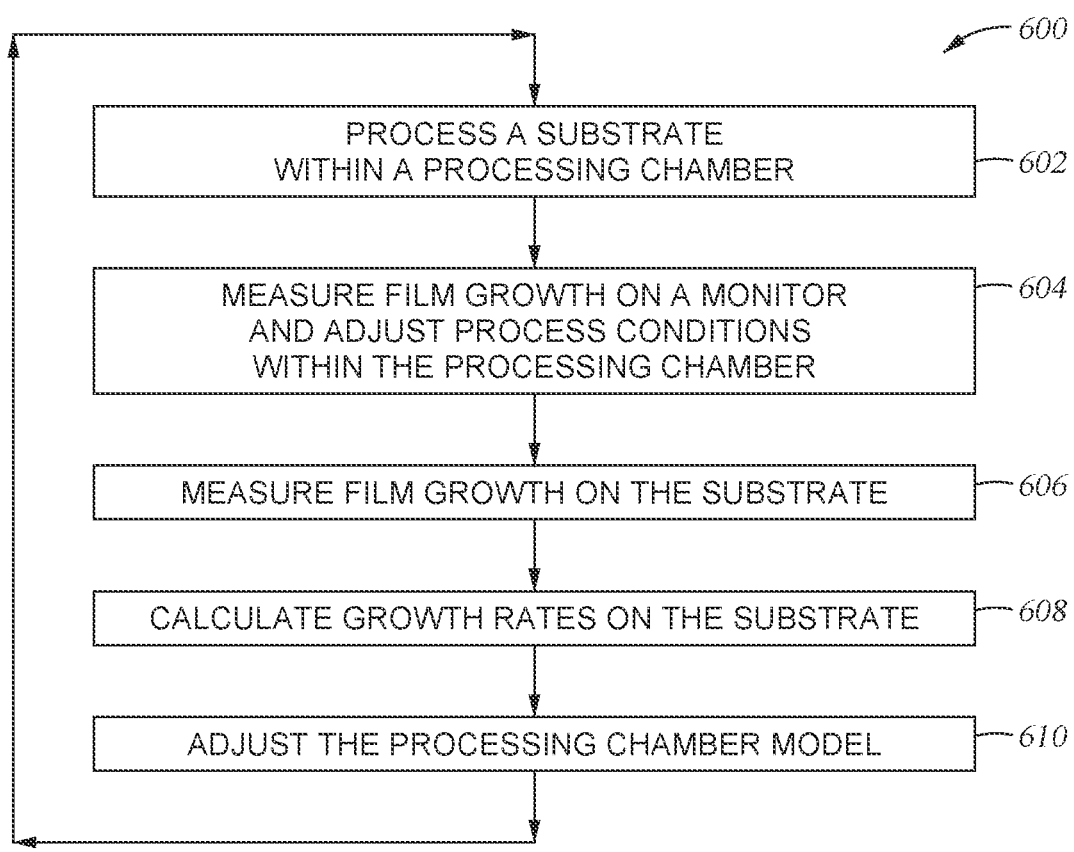
FIG. 6 illustrates a method of adjusting process conditions within the deposition chamber of FIG. 1, according to embodiments of the present disclosure.

FIG. 6 illustrates a method 600 of adjusting process conditions within the deposition chamber 100 of FIG. 1, according to embodiments of the present disclosure. The method 600 utilizes the growth monitors 310 within the deposition chamber 100 as well as the controller 120 described herein to improve film thickness uniformity and properties across the substrate 102.

During the method 600, a first substrate is processed within a processing chamber during an operation 602. The first substrate may be the substrate 102 and the processing chamber is the deposition chamber 100. Processing the first substrate during the operation 602 includes performing a deposition process on the first substrate, such as an epitaxial deposition process. The deposition process grows a film over the first substrate and includes heating the substrate using the upper lamps 141 and the lower lamps 143. Gas is flown through the process volume 136 from the process gas inlets 114 and the purge gas inlets 164 before being removed through the exhaust gas outlets 116.

As the first substrate is being processed within the processing chamber, the growth monitors 310 are used to measure the film thickness growth on the monitors during another operation 604. The measuring of the film thickness growth on the growth monitors 310 is performed as a rolling operation. A controller, such as the controller 120, is configured to receive input from a combination of the growth monitors 310 described with respect to FIGS. 3A-3B. The input is used to estimate film growth on the first substrate. Once the first substrate is done being processed within the processing chamber, the film thickness may be measured using one or more other non-contact sensors within the processing chamber or within an adjacent chamber during another operation 606. Measuring the film growth on the first substrate during the operation 606 is performed in a non-destructive manner, such as by using one or more non-contact sensors. The non-contact sensors may be a laser thickness gauge and may take multiple discreet measurements across the surface of the first substrate or may scan a length of the first substrate.

The non-contact sensors used during the operation 606 are not necessarily utilized for film thickness measurement during substrate processing as the process gases and radiation from the heating sources interfere with sensor readings to reduce reading sensitivity and precision. Therefore, the ability to determine and administer changes to heating and gas flow within a process volume during substrate processing is limited using the non-contact sensors utilized during the operation 606. The growth monitors 310 beneficially enable adjustment of the process conditions, such as heating and gas flow, while the first substrate is being processed.

The measurements of the film growth on the first substrate enables the growth rate on the first substrate to be calculated during another operation 608. Calculating the growth rate on the first substrate during the operation 608 verifies the accuracy of the models used within the controller and enables the processing chamber model to be adjusted during another operation 610. Adjusting the processing chamber model during the operation 610 enables better use of the growth monitors 310 for a specific process. Once the model has been adjusted, processing of another substrate, such as a second substrate, is performed and the operations 602, 604, 606, 608, 610 are repeated. The operations 602, 604, 606, 608, 610 of the method 600 may be looped to continuously adjust the accuracy of the processing chamber model during operation 610 and improve film thickness growth results. When preventative maintenance is performed on the processing chamber, the processing chamber model may be reset or adjusted and the method 600 begins again. Therefore, film thickness results are improved continuously between each substrate. This further enables accurate film thickness and overcomes changes in processing chamber properties as films build up on surfaces within the process volume and as lamps age.

While the foregoing is directed to embodiments of the present disclosure, other and further embodiments of the disclosure may be devised without departing from the basic scope thereof, and the scope thereof is determined by the claims that follow.

What is claimed is:

1. An exhaust passage body applicable for semiconductor substrate processing, comprising:
   a first exhaust plenum;
   a first exhaust entry opening formed through a first end of the exhaust passage body and fluidly connected to the first exhaust plenum;
   a first plurality of fins disposed adjacent to the first exhaust entry opening within the first exhaust plenum;
   a first exhaust exit opening formed through a second end of the exhaust passage body and fluidly connected to the first exhaust plenum;
   a first baffle plate disposed adjacent to the first exhaust exit opening and configured to narrow a first width of the first exhaust plenum; and
   at least one growth monitor disposed downstream of the first baffle plate and configured to measure a thickness of a material deposited on the at least one growth monitor.

2. The exhaust passage body of claim 1, wherein the at least one growth monitor is a quartz crystal film thickness monitor.

3. The exhaust passage body claim 1, wherein the first baffle plate is oriented to narrow the first exhaust plenum as the first exhaust plenum extends towards the first exhaust exit opening.

4. The exhaust passage body of claim 3, further comprising:
   a second exhaust plenum;
   a second exhaust entry opening formed through the first end of the exhaust passage body and fluidly connected to the second exhaust plenum;
   a second plurality of fins disposed adjacent to the second exhaust entry opening within the second exhaust plenum;
   a second exhaust exit opening formed through the second end of the exhaust passage body and fluidly connected to the second exhaust plenum; and
   a second baffle plate disposed adjacent to the second exhaust exit opening and configured to narrow a second width of the second exhaust plenum.

5. The exhaust passage body of claim 1, wherein the first exhaust entry opening has an entry width and the first exhaust exit opening has an exit width, a ratio of the entry width to the exit width being about 2:1 to about 20:1.

6. The exhaust passage body of claim 5, wherein the entry width of the first exhaust entry opening is about 10 mm to about 210 mm.

7. The exhaust passage body of claim 1, wherein the first plurality of fins includes at least four fins.

8. The exhaust passage body of claim 7, wherein each of the first plurality of fins are oriented parallel to one another.

9. An exhaust system applicable for semiconductor substrate processing, comprising:
   an exhaust passage body comprising:
      an exhaust plenum;
      an exhaust entry opening formed through a first end of the exhaust passage body and having an entry width;
      a plurality of fins disposed adjacent to the exhaust entry opening within the exhaust plenum;
      an exhaust exit opening formed through a second end of the exhaust passage body and fluidly connected to the exhaust plenum;

at least one baffle plate disposed adjacent to the exhaust exit opening and configured to narrow a width of the exhaust plenum to an exit width less than the entry width; and at least one growth monitor disposed downstream of the at least one baffle plate and configured to measure a thickness of a material deposited on the at least one growth monitor; and an exhaust collector coupled to the exhaust passage body at the exhaust exit opening.

10. The exhaust system of claim 9, wherein the at least one growth monitor is a quartz crystal film thickness monitor.

11. The exhaust system of claim 10, wherein the quartz crystal film thickness monitor comprises:
a sensor holder;
a quartz crystal disposed within the sensor holder;
a back contact contacting a first side of the quartz crystal;
a front contact contacting a second side of the quartz crystal;
a protective coating disposed on the second side of the quartz crystal; and
a sensor opening disposed through the sensor holder and exposing the protective coating to gases flowing through the exhaust plenum.

12. The exhaust system of claim 11, wherein at least one of the back contact and the front contact comprise a gold material.

13. The exhaust system of claim 11, wherein the protective coating is alumina or silicon dioxide.

14. The exhaust system of claim 9, wherein the plurality of fins are a material with a thermal conductivity of above about 100 W/m·° K.

15. The exhaust system of claim 14, wherein the material contains silicon carbide.

16. The exhaust system of claim 9, wherein the at least one growth monitor is disposed within the exhaust collector adjacent to the exhaust exit opening.

17. The exhaust system of claim 9, wherein the at least one baffle plate is a curved plate.

18. A process system applicable for semiconductor substrate processing, comprising:
a chamber body forming a process volume;
a substrate support disposed within the process volume of the chamber body;
an upper window disposed above the substrate support;
a lower window disposed below the substrate support, wherein each of the upper window and the lower window further define the process volume;
an injector disposed through one side of the chamber body and configured to introduce a process gas to the process volume;
an exhaust system disposed through a second side of the chamber body opposite the injector and comprising:
an exhaust passage body;
an exhaust plenum disposed through the exhaust passage body;
an exhaust entry opening formed through a first end of the exhaust passage body, the exhaust entry opening configured to fluidly connect the exhaust plenum and the process volume;
a plurality of fins disposed within the exhaust plenum;
an exhaust exit opening formed through a second end of the exhaust passage body and fluidly connected to the exhaust plenum;
at least one baffle plate disposed downstream of the plurality of fins and configured to narrow a width of the exhaust plenum to an exit width less than an entry width; and
at least one growth monitor disposed downstream of the at least one baffle plate and configured to measure a thickness of a material deposited on the at least one growth monitor.

19. The process system of claim 18, wherein the at least one growth monitor is in communication with a controller configured to determine growth rates on the at least one growth monitor and adjust at least one of process gas flow rates, heating energy levels, or exhaust flow rates.

20. The process system of claim 19, wherein the controller compares measured growth rates on the at least one growth monitor, a chamber thermal model, a chamber flow model, and previous monitor measurements to determine how to adjust at least one of the process gas flow rates, the heating energy levels, or the exhaust flow rates.

* * * * *